United States Patent
Bhattacharyya et al.

(10) Patent No.: US 11,136,647 B2
(45) Date of Patent: Oct. 5, 2021

(54) DISPENSING OF ALKALI METALS MEDIATED BY ZERO OXIDATION STATE GOLD SURFACES

(71) Applicant: HI LLC, Los Angeles, CA (US)

(72) Inventors: Sukanta Bhattacharyya, Belmont, CA (US); Daniel Sobek, Portola Valley, CA (US)

(73) Assignee: HI LLC, Los Angeles, CA (US)

( * ) Notice: Subject to any disclaimer, the term of this patent is extended or adjusted under 35 U.S.C. 154(b) by 414 days.

(21) Appl. No.: 16/405,382

(22) Filed: May 7, 2019

(65) Prior Publication Data

US 2020/0056263 A1    Feb. 20, 2020

Related U.S. Application Data

(60) Provisional application No. 62/776,895, filed on Dec. 7, 2018, provisional application No. 62/745,144, filed
(Continued)

(51) Int. Cl.
*C22B 26/10* (2006.01)
*C22B 5/16* (2006.01)
*G01R 33/028* (2006.01)

(52) U.S. Cl.
CPC .............. *C22B 26/10* (2013.01); *C22B 5/16* (2013.01); *G01R 33/028* (2013.01)

(58) Field of Classification Search
CPC ........... C22B 26/10; C22B 5/16; C22B 26/12; C22B 26/00; C22B 5/18; C22B 5/02;
(Continued)

(56) References Cited

U.S. PATENT DOCUMENTS 4,951,674 A    8/1990   Zanakis et al.
5,189,368 A    2/1993   Chase
(Continued)

FOREIGN PATENT DOCUMENTS

CN    104730484    6/2015
CN    107562188    1/2018
(Continued)

OTHER PUBLICATIONS

Knapkiewicz, Pawel., "Technological Assessment of MEMS Alkali Vapor Cells for Atomic References.", Dec. 31, 2018 Micromachines vol. 10,1 25., Figure 1 (Year: 2018).*
(Continued)

*Primary Examiner* — Jonathan G Leong
*Assistant Examiner* — Nikolas Takuya Pullen
(74) *Attorney, Agent, or Firm* — Branch Partners PLLC; Bruce E. Black

(57) ABSTRACT

A method for generating alkali metal in a zero oxidation state includes reacting an alkali metal compound having a —S-M substituent, where M is an alkali metal and S is sulfur, with gold in a zero oxidation state to release the alkali metal in the zero oxidation state. For example, an alkali metal alkylthiolate can be reacted with a gold in a zero oxidation state to release the alkali metal in the zero oxidation state. As another example, an alkali metal sulfide can be reacted with gold in a zero oxidation state to release the alkali metal in the zero oxidation state. The alkali metal may be used in various applications including vapor cells, magnetometers, and magnetic field measurement systems.

17 Claims, 2 Drawing Sheets

Related U.S. Application Data on Oct. 12, 2018, provisional application No. 62/719,475, filed on Aug. 17, 2018.

(58) Field of Classification Search
CPC ........... G04F 5/14; G04F 5/145; G01R 33/26;
G01R 33/032; H03L 7/26
See application file for complete search history.

(56) References Cited

U.S. PATENT DOCUMENTS

| | | | |
|---|---|---|---|
| 5,192,921 A | 3/1993 | Chantry et al. | |
| 5,254,947 A | 10/1993 | Chaillout et al. | |
| 5,309,095 A | 5/1994 | Ahonen et al. | |
| 5,442,289 A | 8/1995 | Diorio et al. | |
| 5,444,372 A | 8/1995 | Wikswo, Jr. et al. | |
| 5,471,985 A | 12/1995 | Warden | |
| 5,506,200 A | 4/1996 | Hirschkoff et al. | |
| 5,526,811 A | 6/1996 | Lypchuk | |
| 5,713,354 A | 2/1998 | Warden | |
| 6,144,872 A | 11/2000 | Graetz | |
| 6,339,328 B1 | 1/2002 | Keene et al. | |
| 6,472,869 B1 | 10/2002 | Upschulte et al. | |
| 6,665,553 B2 | 12/2003 | Kandori et al. | |
| 6,806,784 B2 | 10/2004 | Hollberg et al. | |
| 6,831,522 B2 | 12/2004 | Kitching et al. | |
| 7,038,450 B2 | 5/2006 | Romalis et al. | |
| 7,102,451 B2 | 9/2006 | Happer et al. | |
| 7,145,333 B2 | 12/2006 | Romalis et al. | |
| 7,521,928 B2 | 4/2009 | Romalis et al. | |
| 7,656,154 B2 | 2/2010 | Kawabata et al. | |
| 7,826,065 B1 | 11/2010 | Okandan et al. | |
| 7,872,473 B2 | 1/2011 | Kitching et al. | |
| 7,994,783 B2 | 8/2011 | Ledbetter et al. | |
| 8,054,074 B2 | 11/2011 | Ichihara et al. | |
| 8,212,556 B1 | 7/2012 | Schwindt et al. | |
| 8,258,884 B2 | 9/2012 | Borwick, III et al. | |
| 8,319,156 B2 | 11/2012 | Borwick, III et al. | |
| 8,334,690 B2 | 12/2012 | Kitching et al. | |
| 8,373,413 B2 | 2/2013 | Sugioka | |
| 8,405,389 B2 | 3/2013 | Sugioka et al. | |
| 8,587,304 B2 | 11/2013 | Budker et al. | |
| 8,836,327 B2 | 9/2014 | French et al. | |
| 8,906,470 B2 | 12/2014 | Overstolz et al. | |
| 8,941,377 B2 | 1/2015 | Mizutani et al. | |
| 9,095,266 B1 | 8/2015 | Fu | |
| 9,116,201 B2 | 8/2015 | Shah et al. | |
| 9,140,590 B2 | 9/2015 | Waters et al. | |
| 9,140,657 B2 | 9/2015 | Ledbetter et al. | |
| 9,169,974 B2 | 10/2015 | Parsa et al. | |
| 9,244,137 B2 | 1/2016 | Kobayashi et al. | |
| 9,291,508 B1 | 3/2016 | Biedermann et al. | |
| 9,343,447 B2 | 3/2016 | Parsa et al. | |
| 9,366,735 B2 | 6/2016 | Kawabata et al. | |
| 9,383,419 B2 | 7/2016 | Mizutani et al. | |
| 9,395,425 B2 | 7/2016 | Diamond et al. | |
| 9,417,293 B2 | 8/2016 | Schaffer et al. | |
| 9,429,918 B2 | 8/2016 | Parsa et al. | |
| 9,568,565 B2 | 2/2017 | Parsa et al. | |
| 9,575,144 B2 | 2/2017 | Kornack et al. | |
| 9,601,225 B2 | 3/2017 | Parsa et al. | |
| 9,638,768 B2 | 5/2017 | Foley et al. | |
| 9,639,062 B2 | 5/2017 | Dyer et al. | |
| 9,677,905 B2 | 6/2017 | Waters et al. | |
| 9,726,626 B2 | 8/2017 | Smith et al. | |
| 9,726,733 B2 | 8/2017 | Smith et al. | |
| 9,791,536 B1 | 10/2017 | Alem et al. | |
| 9,829,544 B2 | 11/2017 | Bulatowicz | |
| 9,846,054 B2 | 12/2017 | Waters et al. | |
| 9,851,418 B2 | 12/2017 | Wolf et al. | |
| 9,869,731 B1 | 1/2018 | Hovde et al. | |
| 9,915,711 B2 | 3/2018 | Kornack et al. | |
| 9,927,501 B2 | 3/2018 | Kim et al. | |
| 9,948,314 B2 | 4/2018 | Dyer et al. | |
| 9,964,609 B2 | 5/2018 | Ichihara et al. | |
| 9,964,610 B2 | 5/2018 | Shah et al. | |
| 9,970,999 B2 | 5/2018 | Larsen et al. | |
| 10,024,929 B2 | 7/2018 | Parsa et al. | |
| 10,088,535 B1 | 10/2018 | Shah | |
| 10,162,016 B2 | 12/2018 | Gabrys et al. | |
| 2004/0232912 A1 | 11/2004 | Tsukamoto et al. | |
| 2005/0007118 A1 | 1/2005 | Kitching et al. | |
| 2005/0046851 A1 | 3/2005 | Riley, Jr. et al. | |
| 2005/0206377 A1 | 9/2005 | Romalis et al. | |
| 2007/0120563 A1 | 5/2007 | Kawabata et al. | |
| 2007/0167723 A1 | 7/2007 | Park et al. | |
| 2007/0205767 A1 | 9/2007 | Xu et al. | |
| 2009/0079426 A1 | 3/2009 | Anderson | |
| 2009/0101806 A1 | 4/2009 | Masuda | |
| 2010/0219820 A1 | 9/2010 | Skidmore et al. | |
| 2011/0062956 A1 | 3/2011 | Edelstein et al. | |
| 2012/0088106 A1* | 4/2012 | Jing et al. ..................... 428/426 |
| 2012/0112749 A1 | 5/2012 | Budker et al. | |
| 2013/0082700 A1 | 4/2013 | Mizutani et al. | |
| 2013/0082701 A1 | 4/2013 | Mizutani et al. | |
| 2013/0265042 A1 | 10/2013 | Kawabata et al. | |
| 2014/0306700 A1 | 10/2014 | Kamada et al. | |
| 2014/0354275 A1 | 12/2014 | Sheng et al. | |
| 2015/0022200 A1 | 1/2015 | Ichihara et al. | |
| 2015/0054504 A1 | 2/2015 | Ichihara et al. | |
| 2015/0378316 A1 | 12/2015 | Parsa et al. | |
| 2016/0061913 A1 | 3/2016 | Kobayashi et al. | |
| 2016/0116553 A1 | 4/2016 | Kim et al. | |
| 2016/0223627 A1 | 8/2016 | Shah et al. | |
| 2016/0313417 A1 | 10/2016 | Kawabata et al. | |
| 2017/0023653 A1 | 1/2017 | Kobayashi et al. | |
| 2017/0023654 A1 | 1/2017 | Kobayashi et al. | |
| 2017/0199138 A1 | 7/2017 | Parsa et al. | |
| 2017/0261564 A1 | 9/2017 | Gabrys et al. | |
| 2017/0331485 A1* | 11/2017 | Gobet et al. ............... H03L 7/26 |
| 2017/0343617 A1 | 11/2017 | Manickam et al. | |
| 2017/0343695 A1 | 11/2017 | Stetson et al. | |
| 2018/0003777 A1 | 1/2018 | Sorenson et al. | |
| 2018/0038921 A1 | 2/2018 | Parsa et al. | |
| 2018/0100749 A1 | 4/2018 | Waters et al. | |
| 2018/0128885 A1 | 5/2018 | Parsa et al. | |
| 2018/0156875 A1 | 6/2018 | Herbsommer et al. | |
| 2018/0219353 A1 | 8/2018 | Shah | |
| 2018/0238974 A1 | 8/2018 | Shah et al. | |
| 2018/0313908 A1 | 11/2018 | Knappe et al. | |
| 2018/0313913 A1 | 11/2018 | DeNatale et al. | |

FOREIGN PATENT DOCUMENTS

| | | |
|---|---|---|
| EP | 2736627 A3 | 6/2014 |
| EP | 2380029 B1 | 10/2015 |
| EP | 3037836 B1 | 9/2017 |
| JP | 2016109685 | 6/2016 |
| JP | 2018004462 | 1/2018 |
| WO | 2005/081794 | 9/2005 |
| WO | 2014/031985 | 2/2014 |
| WO | 2017/095998 | 6/2017 |

OTHER PUBLICATIONS

Sahoo, H. K., Ottaviano, L,, Zheng, Y., Hansen, O., & Yvind, K. (2018). Low temperature bonding of heterogeneous materials using Al2O3 as an intermediate layer. In Proceedings of SPIE (vol. 10535). [105350V] SPIE—International Society for Optical Engineering. (Proceedings of S P I E—International Society for Optical Engineering). DOI 10.1117/12.2289526.

Douglas, R., van Veggel, A. A., Cunningham, L., Haughian, K., Hough, J., & Rowan, S. (2014). Cryogenic and room temperature strength of sapphire jointed by hydroxide-catalysis bonding. Class. Quantum Grav. 31 (2014) DOI: 10.1088/0264-9381/31/4/045001

Syvain Karlen—Doctorate Thesis—"Fabrication and characterization of MEMS alkali vapor cells used in chip-scale atomic clocks and other atomic devices"—University of Neuchatel—Dec. 2017. (Relevant pages: Chapter 3 44-48).

A. Pelton. The Ca—Na(Calcium-Sodium) system. Bulletin of Alloy Phase Diagrams, 6(1):35-36; 1985.

Abstract for C.-H Lee, H. Guo, S. Radhakrishnam, A. Lal, C. Szekely, T. McClellan, and A. Pisano. A batch fabricated rubidium-

(56) References Cited

OTHER PUBLICATIONS vapor resonance cell for chip-scale atomic clocks. In Solid-State Sensors, Actuators and Microsystems Workshop, Hilton Head Island, SC, United States, 2005. (Abstract only found at https://www.jstage.jst.go.jp/article/ieejsmas/131/7/131_7_251/_article/-char/ja/).
Allred, J. C., Lyman, R. N., Kornack, T. W., & Romalis, M. V. (2002). High-sensitivity atomic magnetometer unaffected by spin-exchange relaxation. Physical review letters, 89(13), 130801.
Balabas et al. Polarized alkali vapor with minute-long transverse spin-relaxation time, Phys. Rev. Lett. 105, 070801—Published Aug. 12, 2010.
Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.
Dmitry Budker and Michael Romalis, "Optical Magnetometry," Nature Physics, 2008, https://arxiv.org/abs/physics/0611246v1.
Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).
Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.
Donley, E.A. & Hodby, E & Hollberg, L & Kitching, J. (2007). Demonstration of high-performance compact magnetic shields for chip-scale atomic devices. The Review of scientific instruments, 78. 083102.
Hämäläinen, Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2.413-497.
Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.
Jimenez-Martinez, R., Griffith, W. C., Wang, Y. J., Knappe, S Kitching, J., Smith, K., & Prouty, M. D. (2010). Sensitivity comparison of Mx and frequency-modulated bell-bloom Cs magnetometers in a microfabricated cell. IEEE Transactions on Instrumentation and Measurement, 59(2), 372-378.
Kiwoong Kim, Sarno Begus, Hui Xia, Seung-Kyun Lee, Voiko Jazbinsek, Zvonko Trontelj, Michael V. Romalis, Multichannel atomic magnetometer for magnetoencephalography: A configuration study. NeuroImage 89 (2014) 143-151 http://physics.princeton.edu/romalis/papers/Kim_2014.pdf.
Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49.
Kominis, I.K., Kornack, T.W., Allred, J.C. and Romalis, M.V., 2003. A subfemtotesla multichannel atomic magnetometer. Nature, 422(6932), p. 596.
Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi:10.1002/2016JA022389.
Lenz, J. and Edelstein, A. ,2006. Magnetic sensors and their applications. IEEE Sensors journal, 6(3) , pp. 631-649.
Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.
Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.

Sander TH, Preusser J, Mhaskar R, Kitching J, Trahms L, Knappe S. Magnetoencephalography with a chip-scale atomic magnetometer. Biomed Opt Express. 2012;3(5):981-90.
J. Seltzer, S & Romalis, Michael. (2010). High-temperature alkali vapor cells with antirelaxation surface coatings. Journal of Applied Physics. 106. 114905-114905. 10.1063/1.3236649.
Seltzer, S. J., and Romalis, M.V., "Unshielded three-axis vector operation of a spin-exchange-relaxation-free atomic magnetometer." Applied physics letters 85.20 (2004): 4804-4806.
Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.
Sheng, Dehong & Li, S & Dural, Nezih & Romalis, Michael. (2013). Subfemtotesla Scalar Atomic Magnetometry Using Multipass Cells. Physical review letters. 110. 160802. 10.1103/PhysRevLett.110.160802.
Volkmar Schultze et al. An Optically Pumped Magnetometer Working in the Light-Shift Dispersed Mz Mode, Sensors 2017, 17, 561; doi:10.3390/s17030561.
Fang, J. and Qin, J., 2012. In situ triaxial magnetic field compensation for the spin-exchange-relaxation-free atomic magnetometer. Review of Scientific Instruments, 83(10), p. 103104.
Joon Lee, Hyun & Shim, Jeong & Moon, Han Seb & Kim, Kiwoong. (2014). Flat-response spin-exchange relaxation free atomic magnetometer under negative feedback. Optics Express. 22. 10.1364/OE.22.019887.
Griffith, Clark & Jimenez-Martinez, Ricardo & Shah, Vishal & Knappe, Svenja & Kitching, John. (2009). Miniature atomic magnetometer integrated with flux concentrators. Applied Physics Letters—Appl Phys Lett. 94. 10.1063/1.3056152.
Lee, S.-K & Romaiis, Michael. 2018. Calculation or Magnetic Field Noise from High-Permeability Magnetic Shields and Conducting Objects with Simple Geometry, Journal of Anplied Physics. 103. 084904-084904. 10.1063/1.2885711.
Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-high vacuum flange for cold atom sensors. Scientific Reports. 8. 10.1038/s41598-018-20352-x.
Kim, Young Jin & Savukov, I. (2016). Ultra-sensitive Magnetic Microscopy with an Optically Pumped Magnetometer, Scientific Reports. 6. 24773. 10.1038/srep24773.
Navau, Carles & Prat-Camps, Jordi & Sanchez, Alvaro. (2012). Magnetic energy Harvesting and Concentration at a Distance by Transformation Optics. Physical review letters. 109. 263903. 10.1103/PhysRevLett. 109.263903.
Orang Alem, Rahul Mhaskar, Ricardo Jimnez-Martnez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).
Slocum et al., Self-Calibrating Vector Magnetometer for Space, https://esto.nasa.gov/conferences/estc-2002/Papers/B3P4(Slocum).pdf.
Dupont-Roc, J & Haroche, S & Cohen-Tannoudji, C. (1969). Detection of very weak magnetic fields (10-9gauss) by 87Rb zero-field level crossing resonances. Physics Letters A—Phys Lett A. 28. 638-639. 10.1016/0375-9601(69) 90480-0.
J. A. Neuman, P. Wang, and A. Gallagher, Robust high-temperature sapphire cell for metal vapors, Review of Scientific Instruments, vol. 66, Issue 4, Apr. 1995, pp. 3021-3023.
Borna, Amir, et al. "A 20-channel magnetoencephalography system based on optically pumped magnetometers." Physics in Medicine & Biology 62.23 (2017): 8909.
R. E. Slocum & L. J. Ryan, Design and operation of the minature vector laser magnetometer, Nasa Earth Science Technology Conference 2003.
Schoenmaker, Jeroen & R Pirota, K & Teixeira, Julio. (2013). Magnetic flux amplification by Lenz lenses. The Review of scientific instruments. 84. 085120. 10.1063/1.4819234.

(56) References Cited

OTHER PUBLICATIONS

Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.
Masuda, Y & Ino, T & Skoy, Vadim & Jones, G.L (2005). 3He polarization via optical pumping in a birefringent cell. Applied Physics Letters. 87. 10.1063/1.2008370.
A.B. Baranga et al., An atomic magnetometer for brain activity imaging, Real Time Conference 2005. 14th IEEE-NPSS. pp. 417-418.
Larry J. Ryan, Robert E. Slocum, and Robert B. Steves, Miniature Vector Laser Magnetometer Measurements of Earth's Field, May 10, 2004, 4 pgs.
Lorenz, V. O., Dai, X., Green, H., Asnicar, T. R., & Cundiff, S. T. (2008). High-density, high-temperature alkali vapor cell. Review of Scientific Instruments, 79(12), 4 pages.
F. Jackson Kimball, D & Dudley, J & Li, Y & Thulasi, Swecha & Pustelny, Szymon & Budker, Dmitry & Zolotorev, Max, (2016). Magnetic shielding and exotic spin-dependent interactions. Physical Review D. 94. 10.1103/PhysRevD.94.082005.
Huang, Haichao, et al. "Single-beam three-axis atomic magnetometer." Applied Physics Letters 109.6 (2016): 062404. (Year: 2016).
Scott Jeffrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalis/papers/Seltzer%20Thesis,pdf [retrieved on Aug. 29, 2019] pp. 148-159.
Haifeng Dong et al.: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.
S. Knappe, V. Shah, P. Schwindt, L. Hollberg, J. Kitching, L. Liew, and J. Moreland. A microfabricated atomic clock. Applied Physics Letters, 65(9):1460-1462, 2004.
L. Nieradko, C. Gorecki, A. Douahi, V. Giordano, J.-C, Beugnot, J. Dziuban, and M. Moraja. New approach of fabrication and dispensing of micromachined cesium vapor cell, Journal of Micro/Nanolithography, MEMS, and MOEMS, 7(3):033013, 2008.
V. Maurice, J. Rutkowski, E. Kroemer, S. Bargiel, N. Passilly, R. Boudot, C. Gorecki, Mauri, and M. Moraja. Microfabricated vapor cells filled with a cesium dispensing paste for miniature atomic clocks. Applied Physics Letters, 110(16):164103, 2017.
V. Maurice, J. Rutkowski, E. Kroemer, S. Bargiel, N. Passilly, R. Boudot, R. Chutani, S. Galliou, and C. Gorecki. Microfabricated vapor cells for miniature atomic clocks based on post-sealing activated cesium dispensers. In International Frequency Control Symposium (IFCS), Joint with the 31st European Frequency and Time Forum (EFTF). pp. 536-637, Besancon, France, 2017.
F. Gong, Y. Jau, K. Jensen, and W. Happen. Electrolytic fabrication of atomic clock cells. Review of Scientific Instruments, 77(7):711-714, 2006.
M. Bick, H. Prinz, and A. Steinmetz. Ullmann's Encyclopedia of Industrial Chemistry, chapter Cesium and Cesium Compounds. Wiley Online Library, 2000.
L. Liew, S. Knappe, J. Moreland, H. Robinson, L. Hollberg, and J. Kitching. Microfabricated alkali atom vapor cells, Applied Physics Letters, 84(14):2694-2696, 2004.
L. Liew, J. Moreland, and V. Gerginov. Wafer-level filling of microfabricated atomic vapor cells based on thin-film deposition and photolysis of cesium azide. Applied Physics Letters, 90(11):114106, 2007.
S. Woetzel, V. Schultze, R. IJsselsteijn, T. Schulz, S. Anders, R. Stolz, and H. Meyer. Microfabricated atomic vapor cell arrays for magnetic field measurements. Review of Scientific Instruments, 82(3):033111, 2011.
W. Wei, J. Shang, W. Kual, S. Qin, T. Wang, and J. Chen. Fabrication of water-level spherical Rb vapor cells for miniaturized atomic clocks by a chemical foaming process. In 13th International Conference on Electronic Packaging Technology & High Density Packaging (ICEPTHDP), pp. 1639-1641, Guilin, Guangxi, China, 2012.
Larry J. Ryan, Robert E. Slocum, and Robert B. Steves; Miniature Vector Laser Magnetometer Measurements of Earth's Field; Polatomic, Inc.; May 10, 2004; 4 pages.
S. Theppakuttai, D. Shao, and S. Chen. Localized Laser Transmission Bonding for Microsystem Fabrication and Packaging. Journal of Manufacturing Processes, 6(1):24-31, 2004.
Evangeline Pensa, Emiliano Cortes; Gastón Corthey, Pilar Carro, Carolina Vericat, Mariano H. Fonticelli, Guillermo Benitez, Aldo A. Rubert, and Roberto C. Salvarezza; The Chemistry of the Sulfur-Gold Interface: In Search of a Unified Model, Accounts of Chemical Research 2012 45 (8), 1183-1192.
Helmut Hinterwirth, Stefanie Kappel, Thomas Waltz, Thomas Prohaska, Wolfgang Lindner, and Michael Lämmerhofer; Quantifying Thiol Ligand Density of Self-Assembled Monolayers on Gold Nanoparticles by Inductively Coupled Plasma-Mass Spectrometry; ACS Nano 2013 7 (2), 1129-1136.
Sasan Asiaei, Patricia Nieva, and Mathilakath M. Vijayan; Fast Kinetics of Thiolic Self-Assembled Monolayer Adsorption on Gold: Modeling and Confirmation by Protein Binding; The Journal of Physical Chemistry B 2014 118 (47), 13697-13703.
Dong Yan, Jeremy A. Saunders, and, and G. Kane Jennings; Kinetics of Formation for n-Alkanethiolate Self-Assembled Monolayers onto Gold in Aqueous Micellar Solutions of C12E6 and C12E7; Langmuir 2002 18 (26), 10202-10212.

\* cited by examiner

DISPENSING OF ALKALI METALS MEDIATED BY ZERO OXIDATION STATE GOLD SURFACES

CROSS-REFERENCE TO RELATED APPLICATIONS

This application claims the benefit of U.S. Provisional Patent Applications Ser. Nos. 62/719,475, filed Aug. 17, 2018; 62/745,144, filed Oct. 12, 2018; and 62/776,895, filed Dec. 7, 2018, all of which are incorporated herein by reference in their entirety.

FIELD

The present disclosure is directed to the area of dispensing alkali metals. The present disclosure is also directed to the generation of alkali metals in the zero oxidation state, as well as applications that include the dispensed alkali metal.

BACKGROUND

The manufacture of vapor cells, used in optical magnetometry and atomic clocks, and alkali metal batteries typically includes the dispensing of alkali metals. In at least some of these products, the alkali metal is present in the zero oxidation state. For example, an alkali metal vapor cell can have a vapor of alkali metal atoms in the zero oxidation state. The reactivity of alkali metals to water, oxygen, and other reactants hinders the dispensing of the alkali metals in the zero oxidation state.

A variety of conventional arrangements are used for the dispensing of alkali metals. The following are a few examples. In one conventional method, an alkali dispenser (such as the arrangement commercialized by SAES Getters) is placed inside a double cavity cell. The dispenser is activated after sealing by local laser heating. This reaction creates cesium and non-reactive side reacting products: $2Cs_2CrO_4+ZrAl_2 \rightarrow 2Cs+Cr_2O_3+Al_2O_3+3ZrO_2$. A similar reaction can be used for rubidium. Drawbacks for this arrangement include the SAES pill being relatively large compared to the size of the cell and the zirconium getter nitrogen complicating cell filing. In a paste version, $Cs_2CrO_4$ is replaced by $Cs_2MoO_4$. The paste contains a stabilizer and a binder.

Another conventional arrangement uses wax packets. In this method, rubidium is enclosed into wax micropacket produced at wafer scale in a glove box. Vapor cells are then produced with only the desired buffer gas pressure. The cells are sealed at the bottom by only a small SiN layer. The micropacket is then attached to the cells by heating. Finally, a laser removes the SiN layer from the inside of the cell releasing the rubidium inside the cell.

Another conventional arrangement utilizes enriched glass electrolysis. A cesium enriched glass is placed in an electric field inside the cell. This results in the cesium diffusing out of the glass.

BRIEF SUMMARY

One embodiment is a method for generating alkali metal in a zero oxidation state that includes reacting an alkali metal compound having a —S-M substituent, where M is an alkali metal and S is sulfur, with gold in a zero oxidation state to release the alkali metal in the zero oxidation state.

In at least some embodiments, the alkali metal compound is an alkali metal alkylthiolate. In at least some embodiments, the method further includes reacting an alkyl thiol with an alkali metal hydroxide or alkali metal amide to form the alkali metal alkylthiolate. In at least some embodiments, the alkali metal compound is an alkali metal sulfide, $M_2S$.

In at least some embodiments, the alkali metal is selected from lithium, sodium, potassium, rubidium, or cesium. In at least some embodiments, the gold is part of a gold surface. In at least some embodiments, the gold surface is a gold(111) surface. In at least some embodiments, the gold surface comprises a gold layer disposed on a substrate.

In at least some embodiments, the alkali metal compound with the gold comprises reacting the alkali metal compound with the gold in an aprotic solvent. In at least some embodiments, the method further includes removing the solvent leaving the zero oxidation state alkali metal.

In at least some embodiments, reacting the alkali metal compound with the gold comprises herein reacting the alkali metal compound with the gold in a vapor cell. In at least some embodiments, the method further includes removing the gold from the vapor cell.

Another embodiments is a method of making an alkali metal vapor cell that includes reacting an alkali metal compound having a —S-M substituent, where M is an alkali metal and S is sulfur, with gold in a zero oxidation state to release the alkali metal in the zero oxidation state; and disposing the alkali metal in the zero oxidation state into a vessel of an alkali metal vapor cell.

In at least some embodiments, the disposing step comprises performing the reacting step in the vessel of the alkali metal vapor cell. In at least some embodiments, the method further includes removing the gold from the vessel of the alkali metal vapor cell.

In at least some embodiments, the reacting step is performed in a solvent in a reaction vessel, wherein disposing the alkali metal comprises transferring the solvent and the alkali metal in the zero oxidation state from the reaction vessel to the vessel of the alkali metal vapor cell and the method further comprises removing the solvent.

In at least some embodiments, the alkali metal compound is an alkali metal alkylthiolate and the method further includes reacting an alkyl thiol with an alkali metal hydroxide or alkali metal amide to form the alkali metal alkylthiolate.

Another embodiment is a vapor cell that includes a vessel; and alkali metal disposed in the vessel, wherein the alkali metal is disposed in the vessel by reacting an alkali metal compound having a —S-M substituent, wherein M is an alkali metal and S is sulfur, with gold in a zero oxidation state to release the alkali metal in the zero oxidation state.

In at least some embodiments, the alkali metal compound is an alkali metal alkylthiolate. In at least some embodiments, the alkali metal compound is an alkali metal sulfide.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Figure 1A:
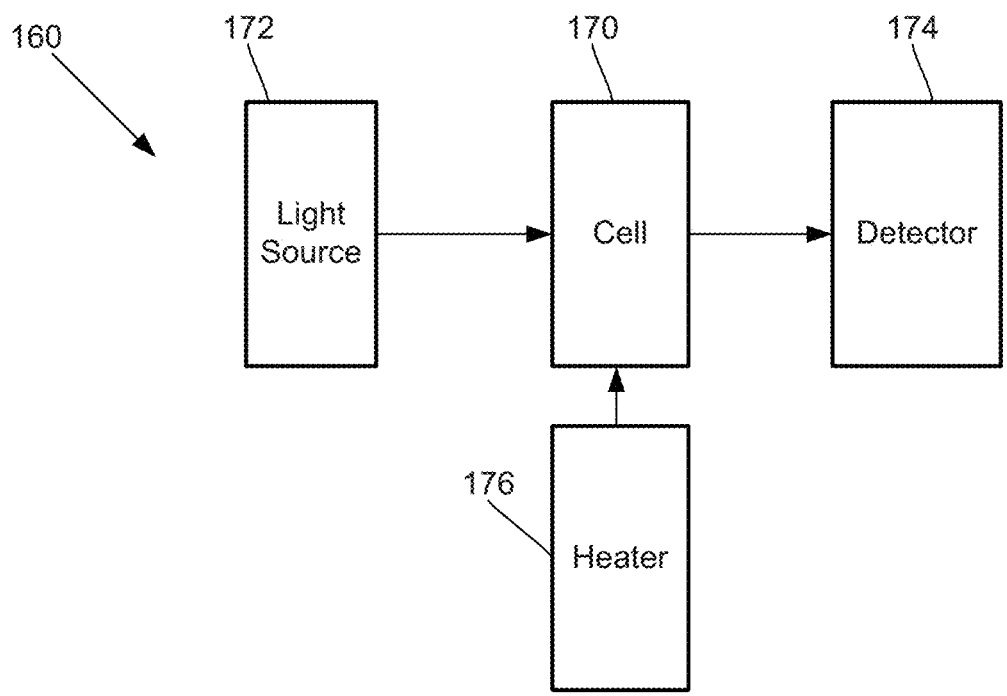
FIG. 1A is a schematic block diagram of one embodiment of a magnetometer, according to the invention.

The present disclosure is directed to the area of dispensing alkali metals. The present disclosure is also directed to the generation of alkali metals in the zero oxidation state, as well as applications that include the dispensed alkali metal.

Conventional methods for generating and dispensing alkali metals in the zero oxidation state may not be suitable or amenable to particular applications. For example, the reaction arrangement may not be suitable for a relatively small vapor cell, the kinetics and equilibrium may not be known, and some of the compounds (e.g., reactants) may be highly toxic.

As described herein, alkali metals in the zero oxidation state can be generated and dispensed through the mediation of a gold surface with zero oxidation state gold atoms. The methods described herein present new chemistry for generating or dispensing alkali metals and can have a number of different features or advantages as described herein. An alkali metal compound having a —S-M substituent (wherein M is an alkali metal and S is sulfur) can react with gold in the zero oxidation state to substitute the gold for the alkali metal (forming a —S—Au linkage) and free the alkali metal in the zero oxidation state. The alkali metal compound can be an organometallic or inorganic compound including, but not limited to, an alkali metal alkylthiolate or an alkali metal sulfide.

At least some embodiments include providing a gold surface presenting zero oxidation state gold (e.g., a gold (111) surface or monolayer). At least some embodiments include providing an organic solvent, with little or no water or water vapor content, for performing a reaction. At least some embodiments include providing an inert gas environment (for example, argon, nitrogen, or any combination thereof) for performing the reaction in a dry environment (for example, a water or water vapor free environment). At least some embodiments include submersing the gold surface and reagents in the solvent so that a reaction releases zero oxidation state alkali metal in the solvent solution.

In at least some embodiments, the methods and schemes described herein can include a reaction arrangement that is compatible with a vapor cell having a small form factor. In at least some embodiments, the methods and schemes can be compatible with fabrication (for example, micro-electromechanical systems (MEMS) fabrication) of a vapor cell. In at least some embodiments, the methods and schemes (or at least a portion of the methods and schemes) can be performed in a target vessel, such as a vapor cell, prior to final assembly of the vapor cell (for example, prior to closure of the vapor cell.)

In at least some embodiments, the methods and schemes can include a dispensed amount of alkali metal that is directly proportional to the surface area of the gold surface. In at least some embodiments, these schemes and methods can provide for accurate and repeatable dispensing of alkali metal.

In at least some embodiments, the schemes and methods can include precursors that are inexpensive and safe (for example, the precursors do not react violently with water or oxygen). In at least some embodiments, the methods and schemes do not require getter gases. In at least some embodiments, the methods and schemes do not require heat or UV light for activation. In at least some embodiments, the reactions can be performed at room temperature. In at least some embodiments, undesired reaction products can be eliminated, reduced, or minimized through the stoichiometry of the reaction.

As indicated above, the methods and schemes described herein include the reaction of an alkali metal compound with a —S-M substitute (where M is an alkali metal and S is sulfur) with gold in the zero oxidation state (such as a gold surface) to substitute the gold for the alkali metal and release the alkali metal in a zero oxidation state. The following Scheme 1 (using an alkali metal alkylthiolate) and Scheme 2 (using an alkali metal sulfide) illustrate example embodiments for the generating or dispensing of alkali metals in the zero oxidation state using a reaction of the indicated alkali metal compounds with gold in the zero oxidation state.

Scheme 1:

In this scheme, an alkali metal alkylthiolate reacts with a gold surface to release the alkali metal in the zero oxidation state. The thioalkyl may be bound to the gold surface as a result of the reaction. In at least some embodiments, the alkali metal alkylthiolate is generated by reaction of an alkyl thiol with an alkali metal hydroxide. Other methods for generating the alkali metal alkylthiolate may also be used.

One embodiment of this set of reactions can be represented by the following reaction equations:

R is an alkyl group (for example, a C4 to C30 branched or unbranched alkyl chain, such as $C_{18}H_{37}$) which may be substituted with one or more substituents that do not interfere with the reaction steps including, for example, ethers, polyethylene glycol ($—CH_2CH_2O—)_n$, carboxylic esters, tertiary amines, and amides;

SH is a thiol group;

R—SH is an alkyl thiol, for example $C_{18}H_{37}SH$;

MOH is an alkali metal hydroxide;

M is an alkali metal (for example, lithium, sodium, potassium, rubidium, cesium, or francium);

$Au^o$ is zero oxidation state gold (e.g., an atom on a Au(111) surface); and $M^o$ is a zero oxidation state alkali metal.

One embodiment of the set of reactions is provided as follows:

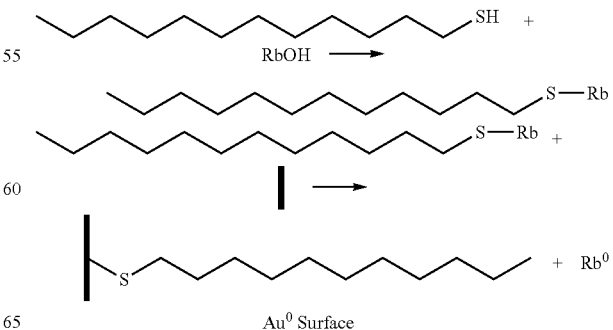

As an embodiment of the set of reactions, in a first step, an alkyl thiol is reacted with an alkali metal hydroxide in an organic solvent such as, for example, acetonitrile, tetrahydrofuran, acetone, N,N-dimethlyformamide (DMF), N,N-dimethylacetamide (DMA), or the like. The product of this reaction is an alkali metal alkylthiolate. Preferably, the solvent contains little (for example, no more than 0.1%) or no water. In at least some embodiments, the solvent is an aprotic solvent. In at least some embodiments, the solvent is a polar aprotic solvent. As an alternative to alkali metal hydroxide, an alkali metal amide can react with the alkyl thiol.

In at least some embodiments, this first reaction is performed in a vessel, such as a gas or vapor cell, into which the zero oxidation state alkali metal, $M^o$, is to be dispensed. In at least some embodiments, this first reaction is performed in an open gas or vapor cell which can be sealed after dispensing the alkali metal (and adding any other suitable components, such as a buffer gas or the like). In other embodiments, the first reaction may be performed in vessel other than the final vessel in which the alkali metal is to be dispensed.

In at least some embodiments, the alkali metal alkylthiolate produced in the first step is isolated or otherwise separated from at least a portion of the reactants prior to proceeding to the next step.

Next, in a second step, a gold surface, presenting zero oxidation state gold, $Au^o$, (such as a Au(111) surface), is brought into contact with the alkali metal alkylthiolate of the first step. In at least some embodiments, this occurs in the original solvent. In other embodiments, the second reaction may be performed using a new or different solvent, such as, for example, acetonitrile, tetrahydrofuran, acetone, N,N-dimethlyformamide (DMF), N,N-dimethylacetamide (DMA), or the like. Preferably, the solvent contains little (for example, no more than 0.01% or 100 ppm) or no water. In at least some embodiments, the solvent is an aprotic solvent.

The gold surface (for example, a Au(111) surface) can be, for example, a thin gold layer formed on a substrate, such as glass, silicon, a ceramic material, plastic, other metal, or the like, including micropipette tips with an inner coating of gold. For example, gold can be deposited (using any suitable deposition technique, such as e-beam evaporation, thermal evaporation, or the like) on the substrate. In at least some embodiments, the substrate may be structured (for example, with peaks and valleys, holes, dimples, pyramidal structures, or any regular or irregular structure, or the like) to increase the surface area of the gold surface. The gold surface can also be gold microsphere beads of various sizes.

In the presence of the zero oxidation state gold, $Au^o$, the alkali metal alkylthiolate decomposes linking the alkyl group to the gold via a thio (sulfur) linkage and releasing the zero oxidation state alkali metal $M^o$ in solution.

In at least some embodiments, subsequent to the second reaction, the gold surface, and accompanying substrate, is removed from the solution. The solvent containing the zero oxidation state alkali metal $M^o$ is evaporated, leaving the zero oxidation state alkali metal $M^o$ in the vessel. In at least some embodiments, this second reaction is performed in a vessel, such as a gas or vapor cell, into which the zero oxidation state alkali metal, $M^o$, is to be dispensed. In at least some embodiments, this second reaction is performed in an open vapor cell vessel. In other embodiments, the second reaction may be performed in a vessel other than the final vessel in which the alkali metal is to be dispensed with the alkali metal (optionally, in solvent) being disposed to the final vessel after the reaction is complete. For example, the solvent with the zero state alkali metal can be aliquoted and transferred to the target vessel, such as a vapor cell, and then evaporated in the target vessel.

In at least some embodiments, the number of alkali metal alkylthiolate molecules is smaller than the capacity of the gold surface. This arrangement may eliminate or reduce the possibility of unreacted contaminants (e.g., alkali metal alkylthiolate) left in the solvent. In at least some embodiments, the gold surface area can be controlled to dispense a relatively precise amount of zero oxidation state alkali metal $M^o$. For example, a 1 $cm^2$ of gold surface may release up to $2.7 \times 10^{14}$ zero oxidation state alkali metal, $M^o$, atoms.

In at least some embodiments, this scheme may be advantageous over conventional alkali metal dispensing methods as many alkane thiols have good solubility in organic solvents because they are surfactants. Selection of a suitable solvent may also enable good solubility for the alkali metal hydroxide.

The gold surface is oxidized during the reaction. In at least some embodiments, the gold surface may be regenerated into a zero oxidation state gold, $Au^o$, surface by exposing the surface to a suitable reducing agent. In at least some embodiments, once regenerated, the gold surface may be reused.

Example 1 of Scheme 1:

Step 1:

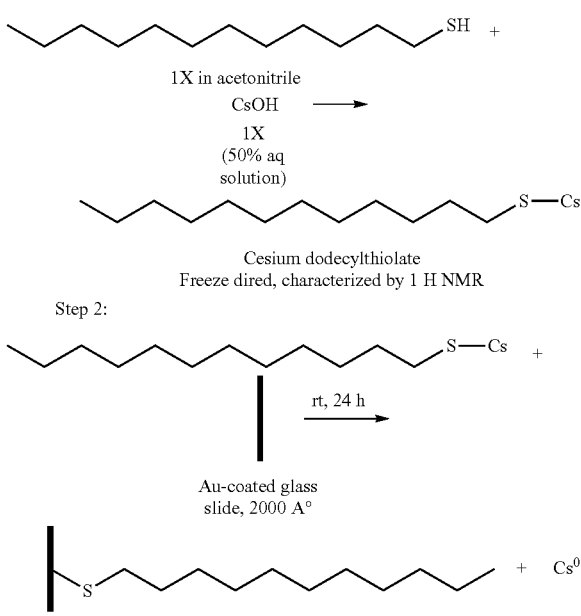

In step 1, dodecanethiol was reacted with CsOH (50% aqueous solution) in acetonitrile to produce cesium dodecylthiolate. This reaction product was lyophilized (freeze dried) to remove all water content. The structure of the product was verified using proton NMR.

In step 2, the cesium dodecylthiolate was then exposed to a gold 111 surface. In particular, gold coated glass slides (25 mm×76 mm with 200 nm thickness of gold) were used for the gold 111 surface. The gold coated glass slides were dipped into a solution (1 mM) of the cesium dodecylthiolate in dry acetonitrile for approximately 24 hours at room temperature under an argon atmosphere. The gold 111 surface reacted with the cesium dodecylthiolate to bind the sulfur atom to the gold surface releasing zero oxidation state cesium into the acetonitrile solution.

The gold surface was then removed from the reaction vessel leaving the zero oxidation state cesium in acetonitrile. The solution was centrifuged and the residue was transferred into a container (15 mm×5 mm), dried, and sealed. In at least some embodiments, no unreacted cesium dodecylthiolate should remain in the solution as long as the gold surface capacity exceeds the amount of cesium dodecylthiolate.

The solution with the zero-oxidation state cesium was transferred to a target vessel (a glass ampule). The target vessel was in an inert gas environment. The acetonitrile was evaporated, leaving the zero oxidation state Cs in the target vessel.

Scheme 2:

In this scheme, an alkali metal sulfide ($M_2S$) reacts with a gold surface to release one of the alkali metal atoms in the zero oxidation and form a gold-sulfur-alkali metal sulfide attached to the gold surface.

One embodiment of this reaction can be represented by the following reaction equation:

$$M_2S + Au^o(\text{surface}) \rightarrow Au\text{---}S\text{---}M + M^o$$

M is an alkali metal (for example, lithium, sodium, potassium, rubidium, cesium, or francium);

$Au^o$ is zero oxidation state gold (e.g., an atom on a Au(111) surface);

$M_2S$ is an alkali metal sulfide (for example, lithium sulfide, sodium sulfide, rubidium sulfide, cesium sulfide, or francium sulfide); and $M^o$ is a zero oxidation state alkali metal.

One embodiment of the reaction is provided as follows:

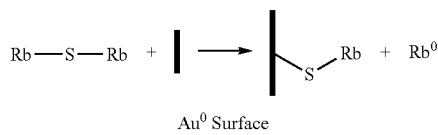

$Au^0$ Surface

Rubidium sulfide ($Rb_2S$) is reacted with a gold(111) surface so that a mixed gold-sulfur-rubidium sulfide is formed on the gold surface releasing one mole equivalent of rubidium metal in the reaction solution.

In general, an alkali metal sulfide, $M_2S$, is disposed in a solvent and is presented to a surface containing zero oxidation state gold, $Au^o$, such as a Au(111) surface. The solvent can be, for example, acetonitrile, tetrahydrofuran, acetone, N,N-dimethylformamide (DMF), N,N-dimethylacetamide (DMA), or the like. Preferably, the solvent contains little (for example, no more than 0.01% or 100 ppm) or no water. In at least some embodiments, the solvent is an aprotic solvent. The products of this reaction are zero oxidation state alkali metal in solution, $M^o$, and a mixed metal-gold sulfide which may be attached onto the gold surface.

The gold surface (for example, a Au(111) surface) can be, for example, a thin gold layer formed on a substrate, such as glass, silicon, a ceramic material, plastic, other metal, or the like, including micropipette tips with an inner coating of gold. For example, gold can be deposited (using any suitable deposition technique, such as e-beam evaporation, thermal evaporation, or the like) on the substrate. In at least some embodiments, the substrate may be structured (for example, with peaks and valleys, holes, dimples, pyramidal structures, or any regular or irregular structure, or the like) to increase the surface area of the gold surface. The gold surface can also be gold microsphere beads of various sizes.

Subsequent to the reaction, the gold surface, and accompanying substrate, is removed from the solution. The solvent containing the zero oxidation state alkali metal $M^o$ is evaporated, leaving the zero oxidation state alkali metal $M^o$ in the vessel.

In at least some embodiments, this reaction is performed in a vessel, such as a gas or vapor cell, into which the zero oxidation state alkali metal, $M^o$, is to be finally dispensed. In at least some embodiments, this reaction is performed in an open vapor cell vessel. In other embodiments, the reaction may be performed in a vessel other than the final vessel in which the alkali metal is to be dispensed with the alkali metal (optionally, in solvent) being disposed to the final vessel after the reaction is complete. For example, the solvent with the zero state alkali metal can be aliquoted and transferred to the target vessel, such as a vapor cell, and then evaporated in the target vessel.

In at least some embodiments, the gold surface area can be controlled to dispense a relatively precise amount of zero oxidation state alkali metal $M^o$. For example, a 1 $cm^2$ of gold surface may release up to $2.7 \times 10^{14}$ zero oxidation state alkali metal, $M^o$, atoms. In at least some embodiments, each alkali sulfide molecule, $M_2S$, yields one zero oxidation state alkali metal $M^o$ in the vessel as long as the number of alkali sulfide molecule, $M_2S$, used in the reaction does not exceed the binding capacity of the zero oxidation state gold, $Au^o$, surface.

The gold surface is oxidized during the reaction. In at least some embodiments, the gold surface may be regenerated into a zero oxidation state gold, $Au^o$, surface by exposing the surface to a suitable reducing agent. In at least some embodiments, once regenerated, the gold surface may be reused.

In at least some embodiments of Scheme 1 and Scheme 2, the reactions may be performed in an inert atmosphere, such as argon, nitrogen, or any combination thereof. In at least some embodiments of Scheme 1 and Scheme 2, the reactions can be performed at ambient (e.g., room) temperature or in a temperature range from 15° C. to 50° C.

The alkali metal obtained using either of the schemes described above can be utilized in a number of different applications. For example, the alkali metal can be dispensed into a vapor cell (or gas cell). One application of such a vapor cell is in an optically pumped magnetometer. FIG. 1A is a schematic block diagram of one embodiment of a magnetometer 160 which includes a vapor cell 170 (also referred to as a gas cell) containing an alkali metal vapor (e.g. rubidium in natural abundance, isotopically enriched rubidium, potassium or cesium), quenching gas (e.g., nitrogen) and buffer gas (e.g., nitrogen, helium, or neon) within a housing; a heating device 176 to heat the vapor cell 170; a light source 172, such as a laser to optically pump the alkali metal atoms and to probe the vapor cell, as well as optics (such as lenses, waveplates, and objects with reflective surfaces) for beam shaping and polarization control and for directing the light from the light source to the cell and detector; and a detector 174 (for example, an optical detector to measure the optical properties of the transmitted light field amplitude, phase, or polarization, as quantified through optical absorption and dispersion curves, spectrum, or polarization or the like or any combination thereof). Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source. Examples of suitable detectors include, but are not limited to, charge coupled device (CCD) camera sensor, photodiode array, single photon avalanche diode (SPAD) array, avalanche photodiode (APD) array, or any other suitable optical sensor array that can measure the change in transmitted light at the optical wavelengths of interest.

Figure 1B:
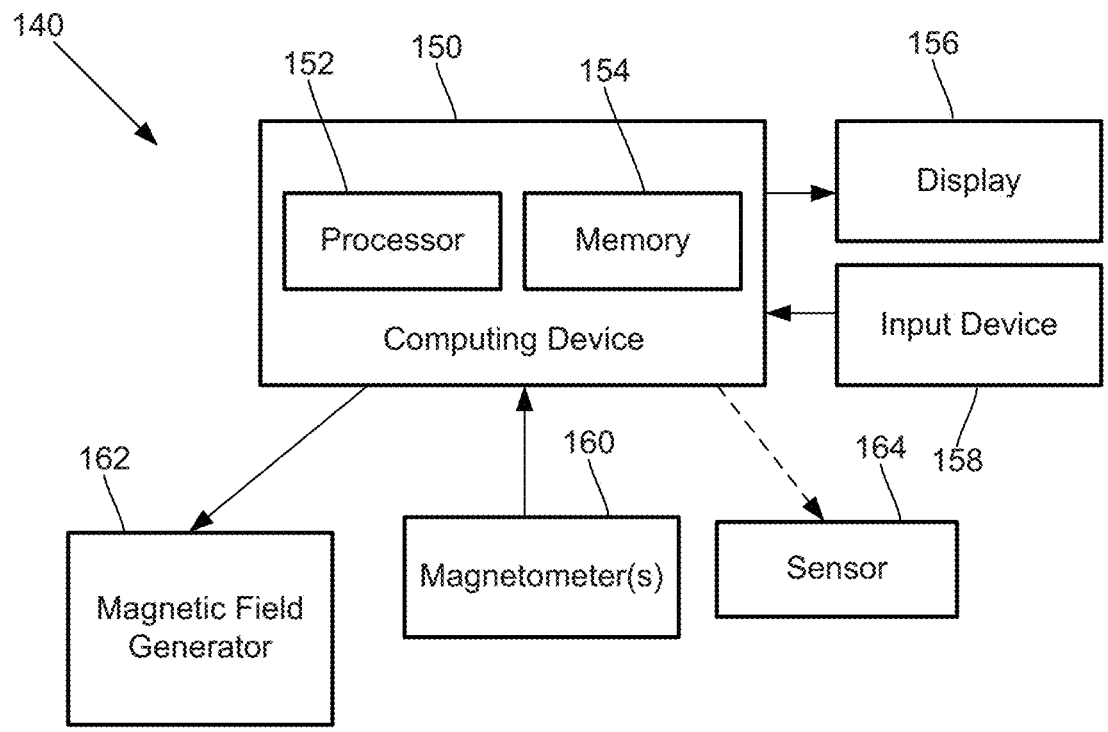
FIG. 1B is a schematic block diagram of one embodiment of a magnetic field measurement system, according to the invention.

A magnetometer can be used as part of a magnetic field measurement system. FIG. 1B is a block diagram of components of one embodiment of a magnetic field measurement system 140. The system 140 can include a computing device 150 or any other similar device that includes a processor 152 and a memory 154, a display 156, an input device 158, one or more magnetometers 160 (for example, one or more vector magnetometers), one or more magnetic field generators 162, and, optionally, one or more sensors 164. The system 140 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 150 can be a computer, tablet, mobile device, or any other suitable device for processing information. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device. The processor 152 is configured to execute instructions provided to the processor 152, as described below.

Any suitable memory 154 can be used for the computing device 150. The memory 154 illustrates a type of computer-readable media, namely computer-readable storage media. Computer-readable storage media may include, but is not limited to, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. The input device 158 can be, for example, a keyboard, mouse, touch screen, track ball, joystick, voice recognition system, or any combination thereof, or the like.

The magnetometers 160 can be any suitable magnetometers including any suitable optically pumped magnetometers. An optically pumped magnetometer (OPM) is a basic component used in optical magnetometry to measure magnetic fields. While there are many types of OPMs, in general magnetometers operate in two modalities: vector mode and scalar mode. In vector mode, the OPM can measure one, two, or all three vector components of the magnetic field; while in scalar mode the OPM can measure the total magnitude of the magnetic field.

Vector mode magnetometers measure a specific component of the magnetic field, such as the radial and tangential components of magnetic fields with respect the scalp of the human head. Vector mode OPMs often operate at zero-field and may utilize a spin exchange relaxation free (SERF) mode to reach femto-Tesla sensitivities. A SERF mode OPM is one example of a vector mode OPM, but other vector mode OPMs can be used at higher magnetic fields. These SERF mode magnetometers can have high sensitivity but may not function in the presence of magnetic fields higher than the linewidth of the magnetic resonance of the atoms of about 10 nT, which is much smaller than the magnetic field strength generated by the Earth. As a result, conventional SERF mode magnetometers often operate inside magnetically shielded rooms that isolate the sensor from ambient magnetic fields including Earth's.

Magnetometers operating in the scalar mode can measure the total magnitude of the magnetic field. (Magnetometers in the vector mode can also be used for magnitude measurements.) Scalar mode OPMs often have lower sensitivity than SERF mode OPMs and are capable of operating in higher magnetic field environments.

The magnetic field measurement systems described herein can be used to measure or observe electromagnetic signals generated by one or more sources (for example, biological sources). The system can measure biologically generated magnetic fields and, at least in some embodiments, can measure biologically generated magnetic fields in an unshielded or partially shielded environment. Aspects of a magnetic field measurement system will be exemplified below using magnetic signals from the brain of a user; however, biological signals from other areas of the body, as well as non-biological signals, can be measured using the system. Uses for this technology outside biomedical sensing include, but are not limited to, navigation, mineral exploration, non-destructive testing, detection of underground devices, asteroid mining, and space applications. In at least some embodiments, the system can be a non-invasive wearable MEG system that can be used outside a magnetically shielded room. Examples of non-invasive magnetic field measurement applications systems or methods are described in U.S. patent application Ser. No. 16/364,338 and U.S. Provisional Patent Application Ser. Nos. 62/829,124 and 62/839,405, all of which are incorporated herein by reference.

The magnetic field generator(s) 162 can be, for example, Helmholtz coils, solenoid coils, planar coils, saddle coils, electromagnets, permanent magnets, or any other suitable arrangement for generating a magnetic field. The optional sensor(s) 164 can include, but are not limited to, one or more magnetic field sensors, position sensors, orientation sensors, accelerometers, image recorders, or the like or any combination thereof.

Figure 2:
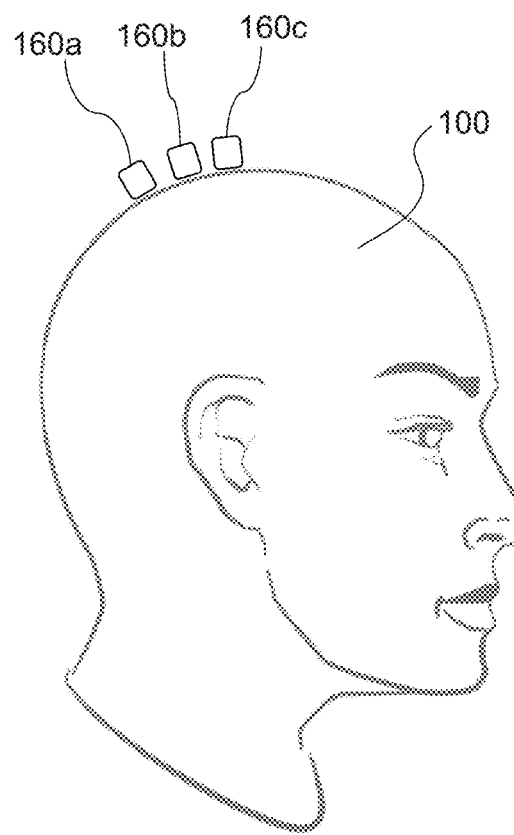
FIG. 2 is a schematic side view of one embodiment of an array of magnetometers for measuring magnetic fields generated in a brain of a user, according to the invention.
Figure 3:
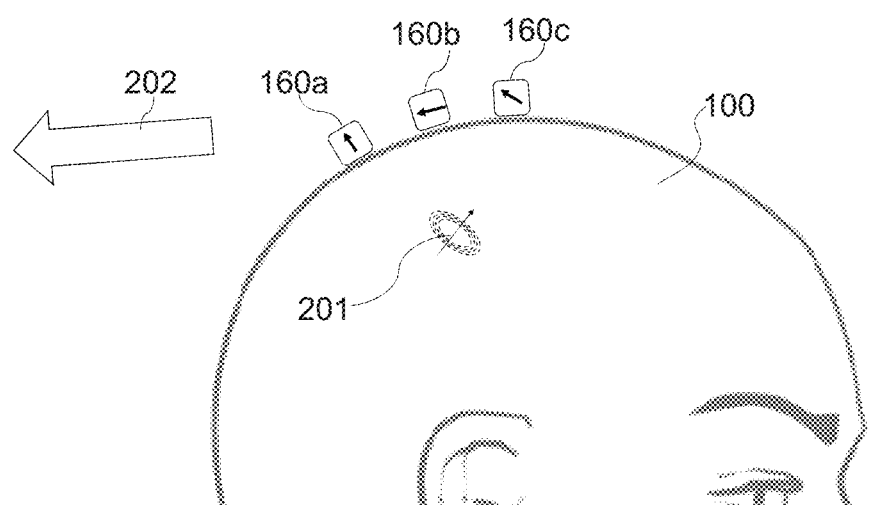
FIG. 3 is a schematic side view of one embodiment of the array of magnetometers of FIG. 2, a signal source in a brain of a user, and a direction of the ambient background magnetic field.

FIG. 2 illustrates one embodiment of a magnetic field measurement system shown with several magnetometers, 160*a*, 160*b*, 160*c* placed on or near a user's head 100 to measure neural activity. FIG. 3 illustrates vector magnetic fields (e.g., signals) that might be generated by the neural activity 201 on each of the magnetometers. For each of the magnetometers 160*a*, 160*b*, 106*c*, the magnetic field vector could be different in both direction and amplitude. The ambient background magnetic field 202 (including, for example, the Earth's magnetic field) is about $10^8$ times larger than magnetic field from the neural activity and is not shown to scale. Examples of magnetic field measurement systems or methods of making such systems or components for such systems are described in U.S. patent application Ser. No. 16/213,980 and U.S. Provisional Patent Application Ser. Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; and 62/842,818, all of which are incorporated herein by reference.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. A method for generating alkali metal in a zero oxidation state, the method comprising
   reacting an alkali metal compound having a —S-M substituent, wherein M is an alkali metal and S is sulfur, with gold in a zero oxidation state to release the alkali metal in the zero oxidation state.

2. The method of claim 1, wherein the alkali metal compound is an alkali metal alkylthiolate.

3. The method of claim 2, further comprising reacting an alkyl thiol with an alkali metal hydroxide or alkali metal amide to form the alkali metal alkylthiolate.

4. The method of claim 1, wherein the alkali metal compound is an alkali metal sulfide, $M_2S$.

5. The method of claim 1, wherein the alkali metal is selected from lithium, sodium, potassium, rubidium, or cesium.

6. The method of claim 1, wherein the gold is part of a gold surface.

7. The method of claim 6, wherein the gold surface is a gold(111) surface.

8. The method of claim 6, wherein the gold surface comprises a gold layer disposed on a substrate.

9. The method of claim 1, wherein reacting the alkali metal compound with the gold comprises reacting the alkali metal compound with the gold in an aprotic solvent.

10. The method of claim 9, further comprising removing the solvent leaving the zero oxidation state alkali metal.

11. The method of claim 1, wherein reacting the alkali metal compound with the gold comprises herein reacting the alkali metal compound with the gold in a vapor cell.

12. The method of claim 11, further comprising removing the gold from the vapor cell.

13. A method of making an alkali metal vapor cell, comprising
    reacting an alkali metal compound having a —S-M substituent, wherein M is an alkali metal and S is sulfur, with gold in a zero oxidation state to release the alkali metal in the zero oxidation state; and
    disposing the alkali metal in the zero oxidation state into a vessel of an alkali metal vapor cell.

14. The method of claim 13, wherein the disposing step comprises performing the reacting step in the vessel of the alkali metal vapor cell.

15. The method of claim 14, further comprising removing the gold from the vessel of the alkali metal vapor cell.

16. The method of claim 13, wherein the reacting step is performed in a solvent in a reaction vessel, wherein disposing the alkali metal comprises transferring the solvent and the alkali metal in the zero oxidation state from the reaction vessel to the vessel of the alkali metal vapor cell, the method further comprising removing the solvent.

17. The method of claim 13, wherein the alkali metal compound is an alkali metal alkylthiolate and the method further comprises reacting an alkyl thiol with an alkali metal hydroxide or alkali metal amide to form the alkali metal alkylthiolate.

* * * * *